United States Patent [19]

Grundke et al.

[11] Patent Number: 5,102,702
[45] Date of Patent: Apr. 7, 1992

[54] BINDER MIXTURES CROSSLINKABLE BY RADIATION

[75] Inventors: Ulrich Grundke; Klaus-Peter Liebetanz, both of Duisburg; Achim Hansen, Düsselforf; Jürgen Zehrfeld, Voerde, all of Fed. Rep. of Germany

[73] Assignee: Rutgerswerke AG, Fed. Rep. of Germany

[21] Appl. No.: 733,424

[22] Filed: Jul. 22, 1991

[30] Foreign Application Priority Data

Aug. 14, 1990 [DE] Fed. Rep. of Germany ....... 4025687

[51] Int. Cl.$^5$ ................ B05D 3/10; C08G 8/36; C08G 59/17; C08L 61/10
[52] U.S. Cl. .................. 427/444; 427/541; 427/352; 525/524; 525/526; 525/527; 525/488; 522/97; 522/108
[58] Field of Search ............ 525/524, 488, 526, 527; 522/97, 108

[56] References Cited

U.S. PATENT DOCUMENTS 4,701,478 10/1987 Jellinek et al. ............... 525/528
4,735,891 4/1988 Budde et al. ............... 525/488

Primary Examiner—John C. Bleutge
Assistant Examiner—Christopher P. Rogers
Attorney, Agent, or Firm—Bierman and Muserlian

[57] ABSTRACT

Binder mixtures crosslinkable by radiation comprising as component A a product obtained by reaction of an epoxy compound with more than one epoxide group per molecule with at least one carboxylic acid in a molar ratio of epoxide groups to carboxyl groups of 1:0.5–0.9 and subsequent reaction of the reaction product with at least one unsaturated isocyanatocarbamate esters and as component B a product obtained by reaction of an epoxy compound with more than one epoxide group per molecule with at least one olefinic unsaturated carboxylic acid in a molar ratio of epoxide groups to carboxyl groups of 1:>>1 and subsequent reaction of the reaction product with at least one polybasic carboxylic acid or anhydride(s) thereof, components A and B being present in a weight ratio of 3:1 to 1:3 useful for the product of superior photo-resists and protective lacquers.

7 Claims, No Drawings

BINDER MIXTURES CROSSLINKABLE BY RADIATION

STATE OF THE ART

Binder mixtures based of epoxy resins which are crosslinkable by radiation and which are hardened by thermal treatments are of great importance in the production of photo-resists and protective lacquers EP-A 0,194,360 discloses analogous binders obtained by reaction of an epoxy compound with more than one epoxide group per molecule with at least one carboxylic acid in a molar ratio of epoxide groups to carboxyl groups of 1 : 0.5–0.9 and subsequent reaction of the reaction product with at least one unsaturated isocyanatocarbamate ester produced by reaction of compounds with at least two isocyanate groups with hydroxyl groupcontaining acrylic, methacrylic or cyanacrylic acid esters.

Lacquers prepared with these binders are outstanding for their good electrical values and excellent mechanical properties of the hardened lacquer film. Such binders are bifunctional, i.e. they contain epoxide groups as well as ethylene-unsaturated groups. The lacquers produced therefrom are partially exposed to activated radiation in a first hardening step, and the covered areas are then removed with a solvent. Then, in a second hardening step, the undeveloped lacquer layers are crosslinked thermally. As cross-linking agent, dicyanodiamide is used among others. It is a disadvantage of these binders that they can not be developed with alkaline aqeous media and hence are not accessible to this more ecophile technology.

OBJECTS OF THE INVENTION

It is an object of the invention to provide a radiation-hardenable binder system which has good mechanical and electrical properties as the ones described above, but which can also be developed both with organic solvents and with alkaline aqueous solutions.

This and other objects and advantages of the invention will become obvious from the following detailed description.

THE INVENTION

The novel binder mixtures of the invention crosslinkable radiation are comprised of as component A a product obtained by reaction of an epoxy compound with more than one epoxide group per molecule with at least one carboxylic acid in a molar ratio of epoxide groups to carboxyl groups of 1:0.5–0.9 and subsequent reaction of the reaction product with at least one unsaturated isocyanatocarbamate esters. The binders of component A are known from EP-A 0,194,360.

Hardener component B is a product obtained by reaction of an epoxy compound with more than one epoxide group per molecule with one or more olefinic unsaturated carboxylic acids in a molar ratio of epoxide groups to carboxy groups of 1:>>1 and subsequent reaction of the reaction product with one or more polybasic carboxylic acids or their anhydride(s).

The two components A and B may be combined with one another in a weight ratio of 3 : 1 to 1 : 3 to obtain a binder mixture which is excellently well storable even without stabilizer, and which can be crosslinked with actinic light, the crosslinked product being able to be after-cured thermally. The resulting end product has good electrical and mechanical properties and particularly good adhesion on plastics, glass, wood and wood materials, especially on metals.

Despite the good storage stability, the binder mixtures of the invention are so reactive that they possess a sufficient crosslinking speed, even without additional radiation-hardening compounds, and are excited to crosslinkage not only by rays but also by UV radiation, and that without subsurface cross linking, they react to a tack-free surface.

With partial exposure, the unexposed areas can surprisingly be detached both with organic solvents and with alkaline aqueous solutions and with mixtures of aqueous and organic solvents. Correspondingly, exposed films of the binder mixture of the invention can therefore be developed with all developing or etching processes currently customary in resist technology.

Moreover, the binders of the invention give films of very high luster, very good and constant mechanical properties, and very high stability to chemicals, since all components contain unsaturated, radiation-hardenable group, which after the exposure are bonded fixed in the polymer network. Hence, upon development with solvents, there is no swelling of the film and dissolving of noncrosslinkable portions which would lead to loss of luster and through alterations of the stoichiometric ratios to deterioration of the mechanical properties and of the stability.

Also, the radiation-hardenable binder mixtures of the invention are distinguished especially by the fact that the polymerization reaction induced by actinic radiation is not continued under the unexposed areas, i.e. subsurface crosslinking does not occur. The unpolymerized portions of the resin are subsequently removed with a solvent or with an alkaline aqueous solution. The unexposed portions dissolved out in developing can be disposed of easily and without harm to the environment by crosslinking reactions and flocculation due to salt-forming reactions.

After complete etching, the lacquer left standing can be transformed on the conductor runs by thermal after curing into a mechanically durable, chemically stable, and thermally and electrically high-grade protective lacquer. Especially advantageous is the good adhesivity on all print supports, this being evident especially in soldering, particularly when printing on bright tin or lead/tin.

Special features of the invention are in addition the very good overprintability or recoatability and adhesion of subsequent prints, e.g. marking prints. An eminent characteristic of the radiation-crosslinkable binder mixtures is an especially good curing, also in the troughs between very high conductor runs, and an especially favorable elasticity behavior, e.g. in temperature cycling. From the radiation-crosslinkable binder mixtures, heat resistant masking lacquers as solder resist with which selected areas of a circuit board are adhesively covered so that in subsequent soldering, no solder tin will deposit. Mass soldering by which many solder joints are produced in one operation is thus possible without a problem.

Due to the reaction behavior of the binder mixtures of the invention and their excellent mechanical and electrcal properties after hardening, they are eminently suitble for the preparation of solder stop-off and protective lacquers for multilayer and printed circuits and as molding compositions for electronics and electrical engineering.

As starting epoxy resins for the binder components A and B are suitable in principle, all compounds which contain more than one epoxide group per molecule. They are obtained either by reaction of polyphenols or polyalcohols with epichlorohyrin e.g. according to U.S. Pat. Nos. 2,467,171; 2,538,072; 2,558,959 and 2,694,694 or by reaction of poly-unsaturated compounds with organic peracids as described among others in U.S. Patents No. 2,853,498; 2,853,499 and No. 2,829,135.

Advantageous are the reaction products of bisphenol-A with epi-chlorohydrin in alkaline medium as well as the polyglycidyl ethers of resorcinol, butanediol, hexanediol, glycerine, trimethylol propane and neopentyl glycol. Preferred representatives of the polyunsaturated compounds epoxidized by peracids are epoxidized cycloolefins such as 3,4-diepoxy-6-methyltetrahydrobenzyl.3',4'-diepoxy-6'-methyl-tetrahydro-benzoate, vinylcyclohexenedioxide, etc., as well as the diglycidyl esters on the basis of anhydrides such as hexahydrophthalic acid or methylnadic acid anhydride.

Specially preferred are all novolacs whose phenolic hydroxyl groups are etherified with glycidyl radicals such as bisphenol-A or bisphenol-F novolac epoxy resins or the corresponding ortho- or paracresol epoxy resin novolac systems or corresponding chlorinated or brominated products for flame-resistant grades. The novolacs required for this can be produced on the basis of phenol, otho-, metha- or para-cresol, dimethyl phenols, higher alkylated phenols, e.g. nonyl phenol, tert.-butyl phenol, or halogated phenols as well as polyphenols such as resorcinol, hydroquinone, pyrocatechin, pyrogallol, phloroglucinol or also trihydroxyphenyl methane or tetrahydroxyphenol ethane, by reaction with aldehydes, preferably formaldehyde, under acid catalysis. These epoxy compounds have the formula

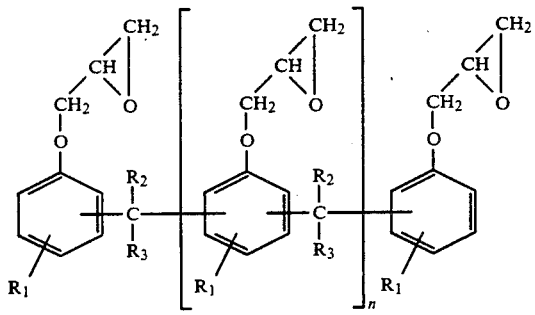

wherein $R_1$ is H—, $CH_3$—, $C_2H_5$—, $C_4H_9$—, Br— or Cl—, $R_2$ is H— or $CH_3$—and $R_3$ is H— or $CH_3$—.

To these epoxy resins may be added before the reaction with carboxylic acid, for the purpose of a better viscosity adjustment mono- and bifunctional epoxy compounds, so-called reactive thinners.

For the preparation of component A, all common monocarboxylic acids may be used as the carboxylic acids. Examples of these are unbranched monocarboxylic acids such as formic acid, acetic acid, propionic acid, lactic acid, stearic acid and also branched carboxylic acids or aromatic carboxylic acids such as benzoic acid or phenylacetic acid and preferably unsaturated carboxylic acids such as acrylic acid, methacrylic acid or cinnamic acid which bring about increased network density.

The reaction takes place in a manner known in itself by mixing the liquid reagents or reagents in solution at elevated temperature. Important for the properties of the end product is the molar ratio of the epoxide groups to the carboxyl groups which must in any event be greater than 1 so that free epoxide groups are present which after the radiation-caused crosslinkage permit thermal hardening. Generally, the ratio is between 1 : 0.5 and 0.9.

The reaction of the epoxy resin systems with the monocarboxylic acids leads to reaction products which are eminently suitable for further reaction with unsaturated isocyanatocarbamate esters. These isocyanatocarbamate esters can be prepared by reaction of polyisocyanates such as 2,4- or 2,6-toluylene diisocyanates or the isomeric mixtures thereof (commercial designation e.g. "Desmodur T 80"), methylene diphenyl diisocyanate, 1,6-hexamethylene diisocyanate, hexane diisocyanate, 1,5-naphthylene diisocyanate, isophorone diisocyanate, trimethylhexamethylene diisocyanate, 4,4', 4",-triphenylmethane-triisocyanate or other known polyisocyanates with hydroxyl group-containing unsaturated esters.

Hydroxyl containing unsaturated esters suitable are particularly hydroxy-ethyl- or propyl-acrylate or the respective hydroxy-methacrylates or hydroxy-cyanacrylates as well as butane or hexanediol-monoacrylates.

The reaction occurs in a manner known in itself in monomolar ratio. The unsaturated isocyanatocarbamate esters have the formula

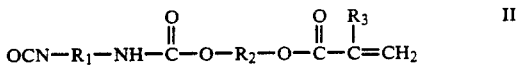

wherein $R_1$ is toluylene (2,4; 2,6)-, 4,4'diphenylmethane-, 1,6-hexamethylene-, 1,5-naphthylene- or isophorone trimethylhexamethylene, $R_2$ is $C_2H_4$—, $C_3H_6$— or $C_4H_8$— and $R_3$ is H—,$CH_3$1', CN—, $C_2H_5$— or $C_3H_7$.

The reaction of the carboxylic acid-modified epoxy resins with the unsaturated isocyanatocarbamate esters also takes place in a known manner, the quantities being selected so that the molar ratios of hydroxyl to isocyanate are in the range of 1 : 0.6 to 1 1. This reaction leads to a very stable binder component which at the same time is highly reactive to actinic radiation. The average molecular weight can be adjusted selectively between 500 and 10,000, depending on the required properties.

For the production of component B, the epoxy compounds are reacted in a known manner with one or more olefin-unsaturated carboxylic acids. Examples of such unsaturated carboxylic acids are purely aliphatic carboxylic acids such as acrylic acid, methacrylic acid, or crotonic acid as well as partial esters of unsaturated dicarboxylic acids such as fumaric acid monoalkyl ester as well as aromatic or heterocyclic substituted unsaturated carboxylic acid such as cinnamic acid or furylacrylic acid. What is important here is the molar ratio of epoxide groups to carboxyl groups which in component B is chosen so that at least the stoichiometric quantity of carboxyl groups corresponding to the epoxide groups is used. A slight excess of unsaturated carboxylic acid is advisable to ensure that the epoxide groups are reacted as completely as possible. A molar ratio of epoxide to carboxyl of 1:1.02–1.03 is preferred.

The hydroxyl groups of the products thus formed are then reacted in a known manner with one or more polybasic carboxylic acids or the anhydride(s) thereof. Examples of such polycarboxylic acids or anhydrides are phthalic acid, trimellitic acid, pyromellitic acid, maleic acid, succinic acid, adipic acid or hexahydrophthalic acid as well as the anhydrides thereof.

The components A and B are storable under exclusion of radiation.

The binder mixture of the invention is produced by simple mixing of the two components under exclusion of high-energy radiation, i.e. either in a darkened chamber or in a special red or yellow light chamber. The weight ratio of the two components may be in the range of 3:1 to 1:3 and the binder mixture is stable for several weeks, offering considerable advantages in use.

Moreover, the binder mixtures of the invention may contain further additives customary in such systems such as photopolymerization initiators, catalysts for thermal after curing, diluents, plasticizers, stabilizers, antifoam or smoothing agents, pigments or fillers.

In particular for controlled adjustment of the UV reactivity, the customary photoinitiators such as benzoins or benzyldimethylketal, benzoin ethers, benzophenones, dithiobis(benzothiazol), oxophosphoranes and combinations of aromatic sulfochlorides with disulfides or xanthogenates can be used to increase the polymerization speed. Curing times of less than 30 seconds can be adjusted without a problem with tack-free films with high mechanical, thermal and electrical property levels and good stability to chemicals being obtainable.

The radiation-crosslinkable binder mixtures are preferably further formulated by addition of catalysts for thermal after curing for the production of I- or II-component coating systems. As latent catalysts for thermal after curing of the epoxide groups with the carboxyl groups are suitable such as imidazoles, tertiary amines or BF$_3$— or also BCl$_3$— amine complexes.

Especially advantageous are latent catalysts which act both in crosslinking as photoinitiators and in thermal hardening as hardening catalysts, particularly compounds of the type of Michler's ketone, which correspond to the formula

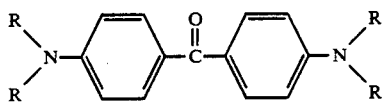

III wherein R is CH$_3$— or C$_2$H$_5$—. Very short curing times of 20 minutes at temperatures of 120° to 230° C., depending on which glass transition point is to be reached for the cured coating system are obtained.

In the following examples, there are described several preferred embodiments to illustrate the invention. However, it should be understood that the invention is not intended to be limited to the specific embodiments.

EXAMPLE 1

Reaction of epoxy resins with carboxylic acid 1.1 A 2-liter three-neck flask with a stirrer, reflux condenser and thermometer was filled with 1 mole (619 g) of a phenol novolac epoxy resin having an average functionality of 3.5 and 200 g of xylene were added. The mixture was heated to above 80° C. and at this temperature, 1.75 mole (129.5 g) of propionic acid were added in drops over 15 to 30 minutes. The mixture was stirred for 3 hours at 80° C. and then the xylene was distilled. The remaining resin composition was taken up in ethylglycol acetate to obtain a 70% resin solution in ethylglycol acetate. The following characteristic specification data were obtained:

| Viscosity/25° C. | 2400–2500 mPa.s |
|---|---|
| nD/25° C. | 1.5200–1.5300 |
| Acid number | 1 mg/g |
| Epoxide number | 8 to 10% |

1.2 A 2-liter three-neck flask with a stirrer, reflux condenser and thermometer was filled with 1 mole (619 g) of a phenol novolac epoxy resin having an average functionality of 3.5 and 200 g of xylene were added. The mixture was heated to about 80° C. and at this temperature, 1.2 mole (120 g) of 1,2-lactic acid (90%) were added in drops over 15 to 30 minutes. The mixture was stirred for 2 hours at 80° C. and then the xylene was distilled. The remaining resin composition was taken up in ethylglycol acetate to obtain a 70% resin solution in ethylglycol acetate. The following characteristic specification data were obtained:

| Viscosity/25° C. | 4000 to 6000 mPa.s |
|---|---|
| nD/25° C. | 1.5200 to 1.5300 |
| Acid number | 1 mg/g |
| Epoxide number | 8 to 10% |

EXAMPLE 2

Reaction of polyisocyanates with hydroxyl group-containing unsaturated compounds A 2-liter three-neck flask with a stirrer, reflux condenser and thermometer was filled with 1 mole (174 g) of toluylene-(2,4 and 2,6) diisocyanate isomer mixture (Desmodur T 80) and 130 g of ethylglycol acetate were added as solvent. To this solution, 1 mole of hydroxyethylacrylate (116 g) were added in portions over 30 minutes which caused the mixture to warm up slowly to about 80° C. At this temperature, the reaction was allowed to continue for about another hour and for stabilization, 0.1% of a stabilizer, e.g. hydroquinone, could be added to obtain 420 g of a 70% reaction mixture in ethylglycol acetate.

EXAMPLE 3

Reaction of hydroxyl group-containing epoxy resins of Example 1 with isocyanate group-containing unsaturated compounds of Example 2.

3.1 A 2-liter three-neck flask with a stirrer, reflux condenser and thermometer was filled with 887 g of the reaction product of Example 2 and was heated to 60° C. At this temperature, 860 g of the reaction product of Example 1.1 were added in portions over one hour. The reaction mixture was allowed to react for about another hour at 60° C. and then cooled to obtain a reaction mass having the following properties:

| Viscosity/25° C. | 12,000 to 15,000 mPa.s |
|---|---|
| nD/25° C. | 1.5100 |
| Solids content | 70% |
| Stability | 6 months in dark storage |

3.2 A 2-liter three-neck flask with a stirrer, reflux condenser and thermometer was filled with 887 g of the reaction product of Example 2 and heated to 60° C. At this temperature, 860 g of the reaction product of Example 1.2 were added in portions over one hour. The reaction mixture was allowed to react for about another hour at 60° C. and then cooled to obtain a reaction mass having the following properties:

| | |
|---|---|
| Viscosity/25° C. | about 15,000–20,000 mPa.s |
| nD/25° C. | 1.5100–1.5200 |
| Solids content | about 70% |
| Stability | 6 months in dark storage |

EXAMPLE 4

Reaction of epoxy resins with acrylic acid and then reaction with succinic acid anhydride A 2-liter three-neck flask with a stirrer, reflux condenser and thermometer was filled with 615 g of a bisphenol A novolac epoxy resin obtained from bisphenol A and formalin and subsequent reaction with eichlorohydrin having an average functionality of 8, an epoxide eqivalent of 205 and a viscosity of 1,240 mPa.s at 150° C. 484 g of methoxypropyl acetate were added and the mixture was heated to 80° C. At this temperature, 219 g of acrylic acid were added and the mixture was stirred for about 60 hours at 80° C. until the acid number dropped to 3. Then, 300 g of succinic acid anhydride were added to the reacton mixture followed by stirring for about 20 hour at 75° C. The product had a viscosity of 43,200 mPa.s at 25° C., an index of refraction of nD25 =1.5030, and a solids content of 70%.

EXAMPLE 5

Reaction of an epoxy resin with acrylic acid and phthalic acid anhydride

Example 4 was repeated except in place of the succinic acid anhydride, 444 g of phthalic acid anhydride were used. After the reaction, the solution was adjusted to a solids content of 70% with methoxy propyl acetate.

| Product data | |
|---|---|
| Viscosity | 19,350 mPa.s at 25° C. |
| Index of refraction nD25 | 1.5110 |

EXAMPLE 6

Reaction of an epoxy resin with acrylic acid and hexahydrophthalic acid anhydride Example 4 was repeated except in place of the succinic acid anhydride, 462 g of hexahydrophthalic acid anhydride were used. After the reaction, the solution was adjusted to a solids content of 70% with methoxy propyl acetate.

| Product data | |
|---|---|
| Viscosity | 20,950 mPa.s at 25° C. |
| Index of refraction nD25 | 1.5010 |

EXAMPLE 7

Reaction of an epoxy resin with acrylic acid and succinic acid anhydride

Example 4 was repeated except in place of the bisphenol-A novolac epoxy resin, 630 g of an o-cresol novolac epoxy resin having an average functionality of 6, epoxide equivalent of 210 and a viscosity of 1.105 mPa.s at 150° C. were used.

| Product data | |
|---|---|
| Viscosity | 20,730 mPa.s at 25° C. |
| Index of refraction nD25 | 1.5300 |

EXAMPLE 8

Reaction of an epoxy resin with acrylic acid and succinic acid anhydride

Example 4 was repeated except in place of the bisphenol-A novolac epoxy resin, 531 g of a phenol novolac epoxy resin having an average functionality of 3.5, an epoxide equivalent of 177 and a viscosity of 1,100 mPa.s at 80° C. were used.

| Product data | |
|---|---|
| Viscosity | 5,900 mPa.s at 25° C. |
| Index of refraction nD25 | 1.5000 |

Preparation of the lacquer components

From the products of Example 3 in combination with the products of Examples 4 to 8, lacquers of Examples 9 to 13 were produced by the methods common in the lacquer industry using pigments, fillers, thinners and additives. Example 14 serves as comparison example.

TABLE 1

| | Ex. | | | | | |
|---|---|---|---|---|---|---|
| | 9 | 10 | 11 | 12 | 13 | 14 |
| Comp. A | | | | | | |
| Product from Ex. 3.1 | | | 40.0 | 28.0 | | |
| Product from Ex. 3.2 | 40.0 | 28.0 | | | 48.0 | 77.0 |
| Benzildimethylketal | 3.5 | 3.5 | 3.5 | 3.5 | 3.5 | 3.5 |
| Phthslocyanine green | 0.2 | 0.2 | 0.2 | 0.2 | 0.2 | 0.2 |
| Filler | 6.3 | 3.3 | 6.3 | 3.3 | 8.3 | 9.3 |
| | 50.0 | 35.0 | 50.0 | 35.0 | 60.0 | 90.0 |
| Comp. B | | | | | | |
| Product from Ex. 4 | 35.0 | | | | | |
| Product from Ex. 5 | | 45.0 | | | | |
| Product from Ex. 6 | | | 35.0 | | | |
| Product from Ex. 7 | | | | 44.0 | | |
| Product from Ex. 8 | | | | | 27.0 | |
| Thinner | 8.0 | 9.0 | 8.0 | 10.0 | 6.0 | 3.2 |
| Leveling agent | 0.5 | 0.5 | 0.5 | 0.5 | 0.5 | 0.5 |
| Phenylimidazol | 0.1 | 0.1 | 0.1 | 0.1 | 0.1 | |
| Filler | 6.4 | 10.4 | 6.4 | 10.4 | 6.4 | 5.0 |
| Dicyandiamide | | | | | | 1.3 |
| | 50.0 | 65.0 | 50.0 | 65.0 | 40.0 | 10.0 |

Trial lacquering

The components A and B of Examples 9 to 14 were mixed by weight according to Table 1 and applied on a copper-backed circuit board with a dry film thickness of 30 um and were dried in a circulating air drying oven for 30 minutes at 80° C. Then, the sample was masked with a template and partially exposed to UV light. The circuit boards were developed. For application as solder resist, the circuit boards were then subjected to a thermal after treatment. The after curing was carried out within 20 to 30 minutes at temperatures of 120° to 150° C., depending on what glass transition point was desired for the cured coating material. Then the soldering process began. Table 2 shows the results.

TABLE 2

| | Example | | | | | |
|---|---|---|---|---|---|---|
| | 9 | 10 | 11 | 12 | 13 | 14 |
| Tack after 1st drying | none | none | none | none | none | none |
| Developing in 1% aqueous soda soln | + | + | + | + | + | not possible |
| Developing in diethyleneglycol monobutyl ether | + | + | + | + | + | + |
| Solder bath test 10 s/ 288° C. | passed | passed | passed | passed | passed | passed |
| Adhesion | + | + | + | + | + | + |
| Insulation resistance acc. to IPC-SM 840 B [Ohm] | >10$^9$ | >10$^9$ | >10$^9$ | >10$^9$ | >10$^9$ | >10$^9$ |

Various modifications of the compositions and method of the invention may be made without departing from the spirit or scope thereof and it is to be understood that the invention is intended to be limited only as defined in the appended claims.

What we claim is:

1. A binder mixture crosslinkable by radiation comprising as component A a product obtained by reaction of an epoxy compound with more than one epoxide group per molecule with at least one carboxylic acid in a molar ratio of epoxide groups to carboxyl groups of 1 : 0.5–0.9 and subsequent reaction of the product with at least one unsaturated isocyanatocarbamate ester produced by reaction of compounds with at least two isocyanate groups with hydroxyl group-containing acrylic, methacrylic or cyanacrylic acid esters and as component B a product obtained by reaction of an epoxy compound with more than one epoxide group per molecule with at least one olefinic unsaturated carboxylic acid in a molar ratio of epoxide groups to carboxyl groups of 1 : 1 and subsequent reaction of the reaction product with at least one polybasic carboxylic acid or anhydride(s) thereof, components A and B being present in a weight ratio of 3 : 1 to 1 : 3.

2. A binder mixture of claim 1 wherein for both components, the epoxy compound is a novolac whose phenolic hydroxyl groups are etherified with glycidyl groups.

3. A binder mixture of claim 2 wherein the epoxy compound contains additions of mono- or bifunctional epoxy compounds.

4. A binder mixture of claim 1 wherein component A has an average molecular weight of 500–10,000.

5. A binder mixture of claim 1 wherein for the production of the component A the carboxylic acid epoxy product and the isocyanatocarbamate esters are reacted with one another in a molar ratio of hydroxyl groups to isocyanate groups of 1 : 0.8 to 1 : 1.

6. In a method of forming films of a binder mixture by radiation crosslinking, the improvement comprising using the binder mixture of claim 1.

7. The method of claim 6 wherein the cured film is etched with a solvent to remove uncrosslinked components and then subjected to thermal curing.

* * * * *